(12) United States Patent
Banghart et al.

(10) Patent No.: US 6,624,453 B2
(45) Date of Patent: Sep. 23, 2003

(54) LATERAL OVERFLOW DRAIN, ANTI-BLOOMING STRUCTURE FOR CCD DEVICES HAVING IMPROVED BREAKDOWN VOLTAGE

(75) Inventors: Edmund K. Banghart, Pittsford, NY (US); Eric G. Stevens, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/945,034

(22) Filed: Aug. 31, 2001

(65) Prior Publication Data

US 2003/0042510 A1 Mar. 6, 2003

(51) Int. Cl.$^7$ ............................................. H01L 31/062
(52) U.S. Cl. ........................ 257/223; 257/290; 257/291
(58) Field of Search ................................ 257/222–223, 257/229–230, 232, 234, 239, 243, 290–291

(56) References Cited

U.S. PATENT DOCUMENTS 4,774,557 A * 9/1988 Kosonocky ................. 257/222
2002/0149078 A1 * 10/2002 Hynecek ..................... 257/461

\* cited by examiner

*Primary Examiner*—Minh Loan Tran
*Assistant Examiner*—Thomas L Dickey
(74) *Attorney, Agent, or Firm*—Peyton C. Watkins

(57) ABSTRACT

An image sensor having an anti-blooming structure, where the image sensor comprises a substrate of a first conductivity type; a dielectric having a first thin portion and a second thick portion; a buried channel of the second conductivity type within the substrate substantially spanning the first thin portion; and a lateral overflow drain region of the second conductivity type disposed substantially in its entirety spanning a portion of the second thick portion for collecting excess photogenerated charges for preventing blooming.

12 Claims, 3 Drawing Sheets

LATERAL OVERFLOW DRAIN, ANTI-BLOOMING STRUCTURE FOR CCD DEVICES HAVING IMPROVED BREAKDOWN VOLTAGE

FIELD OF THE INVENTION

The invention relates generally to the field of image sensors and, more particularly, to such image sensors having a lateral overflow drain substantially underneath a thick field dielectric.

BACKGROUND OF THE INVENTION

In full frame type, charge-coupled device (CCD) image sensors, lateral overflow drain (LOD) structures are formed along with vertical CCD shift registers to provide means for conducting excess electrical charges away from the imaging area. Such removal is necessary to prevent the image defect known as blooming in the CCD pixels, in which the column becomes either partially or completely flooded with charge thereby destroying the intended image. Referring to FIG. 1, an illustration of a conventional lateral overflow drain structure is shown drawn at the center of two adjacent columns. To form the LOD, an implant consisting of n-type impurities is made through the thin gate dielectric at the edge of the device active area and is aligned to a region of thick field oxidation that has been grown to provide electrical isolation between the vertical CCD columns of the imaging area. Electrical isolation is also provided by a p-type implant made under the field oxidation. Upon illumination of the array, photogenerated electrical charge is collected in the implanted n-type buried channel regions. To prevent blooming at high illumination levels, a region of the buried channel is compensated with p-type impurities to form an electrostatic potential barrier to the LOD. Thus, excess electrical charges, that would normally overfill the buried channel regions and bloom up and down the columns, instead find an outlet over the LOD barrier into the n-type LOD drain where they can be safely conducted away from the imaging area. A plot of the electrostatic potential, or channel potential, versus position for the structure under typical operational condition appears in FIG. 3.

In order to provide a sufficient level of conductivity to handle the large amounts of overflow current typically required for high-performance imaging applications, it is usually necessary to introduce a large dose of n-type impurities to form the LOD. However, it is found from numerical simulation of the device shown in FIG. 1 that a practical limitation on the amount of n-type impurities that can be implanted (and therefore an upper bound on the lateral overflow drain conductivity) is reached when the electrical fields produced at the silicon surface become high enough to cause electrical breakdown of the LOD via the impact ionization mechanism (also known as avalanche breakdown) or via quantum mechanical band-to-band tunneling. In simple terms, electrical breakdown results in the generation of undesirably large electric currents. The breakdown condition ordinarily is produced as the applied bias on the device electrodes is increased. It should be evident to those skilled in the art that the conditions for avalanche breakdown are most severe for the accumulation mode of operation, where the gate electrodes are typically placed at −10 volts. Because the lateral overflow drain is usually biased at 10 volts, a total of 20 volts is placed across the thin gate dielectric, with the highest electric field occurring at the silicon surface above the center of the lateral overflow drain implant. A representative plot of the surface electric field strength versus position of FIG. 1 is shown in FIG. 2.

Consequently, a need exists for a CCD LOD anti-blooming structure with a breakdown voltage much higher than the surface limit such that increases in the LOD dose provide improvements in conductivity and the amount of blooming protection.

SUMMARY OF THE INVENTION

The present invention is directed to overcoming one or more of the problems set forth above. Briefly summarized, according to one aspect of the present invention, the invention resides in an image sensor having an anti-blooming structure, where the image sensor comprises (a) a substrate of a first conductivity type; (b) a dielectric having a first thin portion and a second thick portion; (c) a buried channel of the second conductivity type within the substrate substantially spanning the first thin portion; and (d) a lateral overflow drain region of the second conductivity type disposed substantially in its entirety spanning a portion of the second thick portion for collecting excess photogenerated charges for preventing blooming.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of placing the lateral overflow drain underneath a thick dielectric layer so that a substantially lower electric field results at the silicon surface which permits a greater amount of n-type impurities to be used for providing enhanced conductance.

DETAILED DESCRIPTION OF THE INVENTION

In the following preferred embodiment, it is to be understood that terms such as "underneath," "beneath," and the like are words of convenience and are not to be construed as limiting terms. Also, as used herein, thick field dielectric means a field dielectric layer that is thicker than the active area dielectric.

Figure 4:
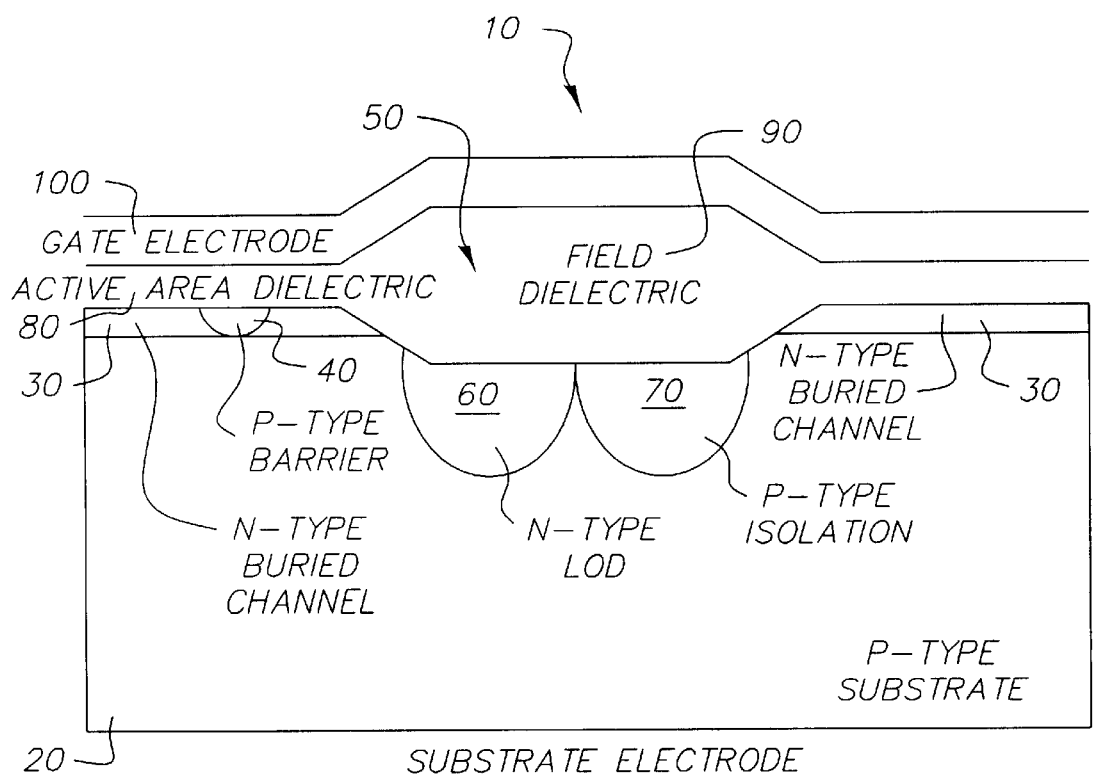
FIG. 4 is a view in vertical cross section of the charge-coupled device and anti-blooming structure of the present invention.

Referring to FIG. 4, there is shown the CCD and its lateral overflow drain anti-blooming structure 10. It is to be noted that a method for creating the CCD and anti-blooming structure of the present invention is disclosed in U.S. patent application Ser. No. 09/944,548, filed Aug. 31, 2001, A METHOD FOR CREATING AN ANTI-BLOOMING STRUCTURE IN A CHARGE COUPLED DEVICE, by Eric G. Stevens, and is incorporated by reference herein. The CCD 10 includes a p-type substrate 20 having a plurality of n-type buried channels 30 for collecting incident light in the form of electrons. A plurality of barriers 40 is disposed in the substrate 20 and defines a maximum energy level for charge collection in the burned channel 30, over which excess photogenerated electrical charges flow.

A dielectric 50 is formed (deposited or grown) atop the buried channel 30 and extends over the barrier 40, lateral overflow drain 60 and channel stop 70. Both latter components are described in detail herein below. The dielectric 50 includes a thin, active area dielectric region 80 positioned substantially above the buried channel 30 and barrier 40, and includes a thick dielectric region 90 positioned substantially between the spaced-apart buried channels 30. A gate electrode 100 is disposed atop the entire dielectric 50. The active area dielectric 80 is preferably comprised of either oxide-nitride-oxide (ONO), oxide-nitride (ON), or oxide, and the thick dielectric 90 is preferably comprised of oxide, as this simplifies the manufacturing process.

The n-type drain 60 is positioned substantially (either wholly or for the most part) in its entirety beneath a portion of the thick field dielectric 90 for collecting the excess photogenerated electrical charges flowing over the barrier 40. The p-type channel stop 70 is preferably positioned adjacent the lateral overflow drain 60 also substantially in its entirety beneath a portion of the thick field dielectric 90 for forming a boundary for the drain region 60. It is instructive to note that the p-type channel need not be positioned under the thick field dielectric as other positions are also viable.

Figure 1:
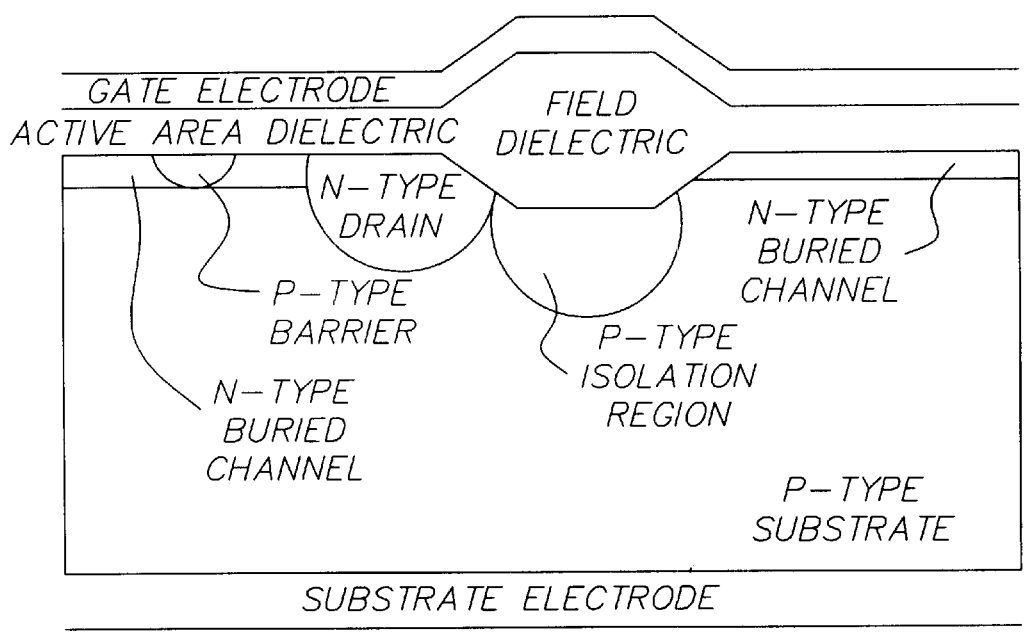
FIG. 1 is a view in vertical cross section of a prior art charge coupled device and its anti-blooming.
Figure 2:
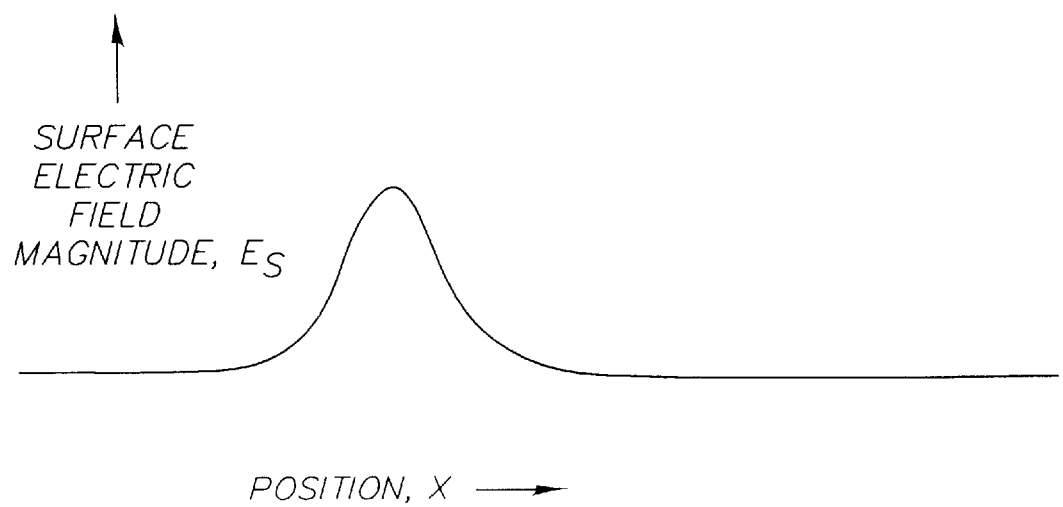
FIG. 2 is a plot of the surface electric field of FIG. 1.
Figure 3:
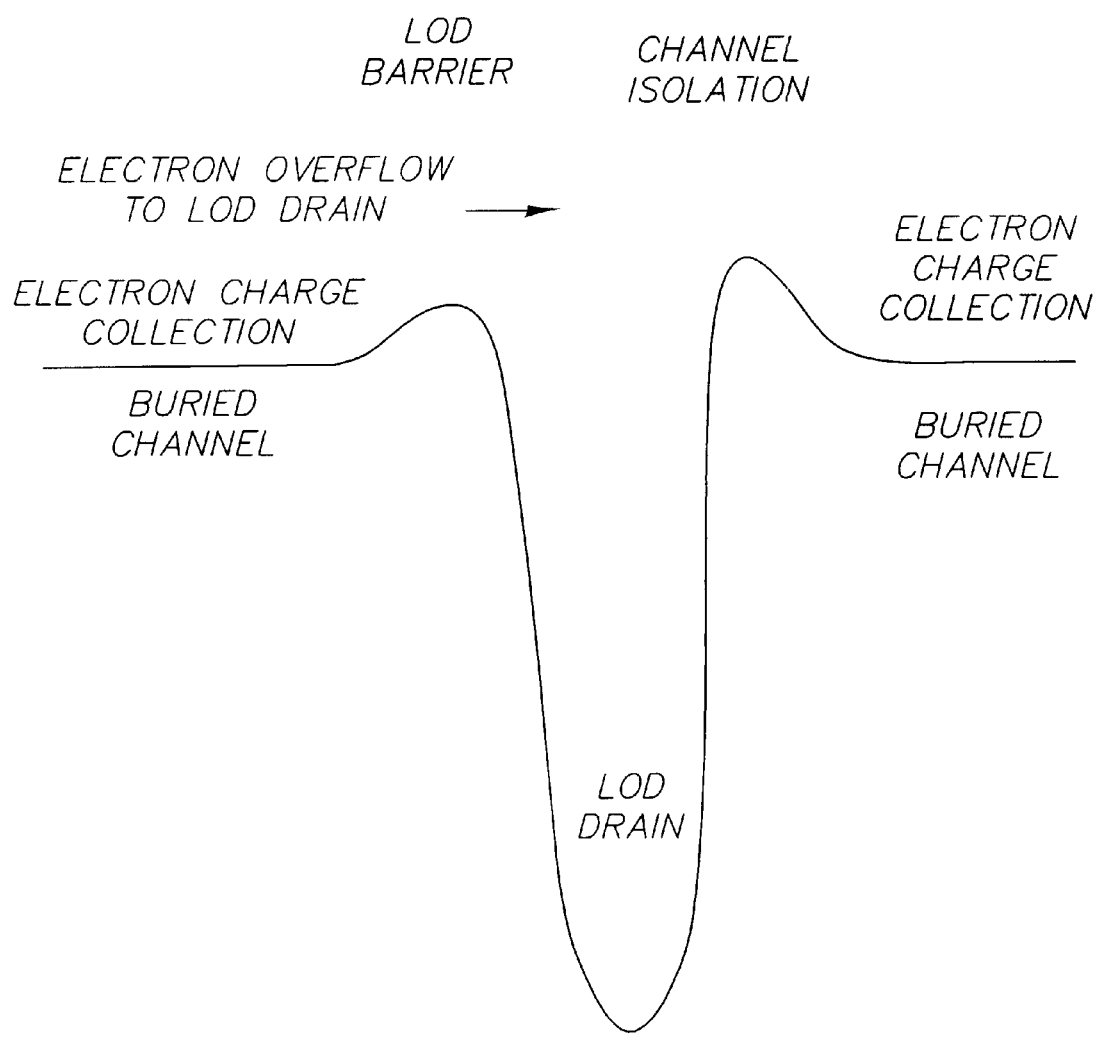
FIG. 3 is a plot of the electrostatic potential maximum versus position in the prior art CCD and anti-blooming structure of FIG. 1.
Figure 5:
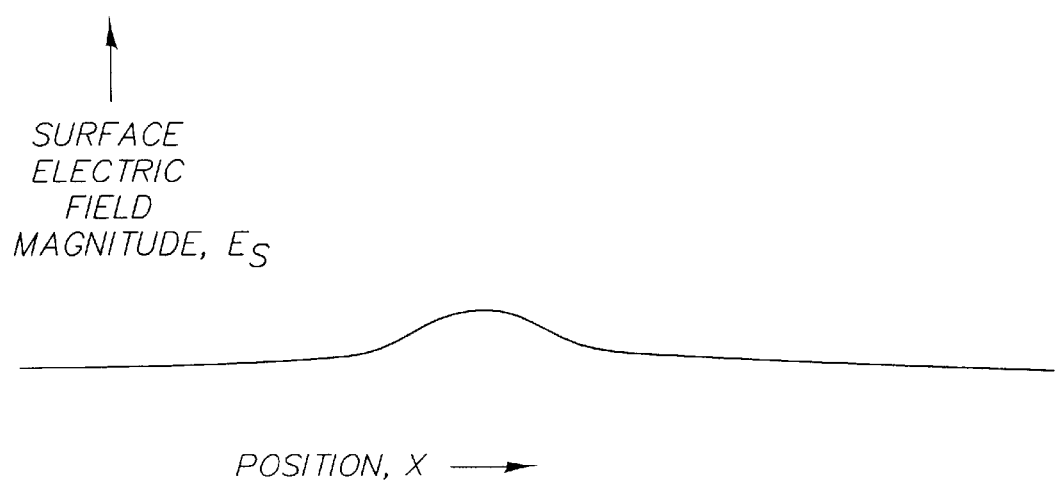
FIG. 5 is the surface electric field of FIG. 4.

It is to be noted that because the lateral overflow drain 60 is insulated from the gate electrode 100 by a thick dielectric layer 90 (for example, 3000 to 4000 angstroms of oxide instead of 500 angstroms as in the prior art), a much lower electric field results at the silicon surface. A representative plot of the surface electric field strength versus position of FIG. 4 is shown in FIG. 5 for the CCD and its antiblooming structure 10 of the present invention and should be compared with the plot of FIG. 2 for the conventional lateral overflow drain structure. Significantly, the lower electric field means that a greater amount of n-type impurities can be used in the LOD formation, which provides substantial improvements in the conductance when compared with the conventional design. Furthermore, it is clear the improved conductance can be used to significantly narrow the LOD width, and therefore permit the design of higher resolution (i.e., smaller pixels) imaging arrays without sacrificing charge capacity in the pixels. Alternatively, the higher breakdown voltages for the new structures could be used to improve device yield by permitting a larger operational range of applied voltages on the gate and LOD electrodes.

Another important advantage of the lateral overflow drain structure of the present invention is the preferential use of arsenic impurities rather than phosphorus impurities as the n-type dopant. In the conventional LOD structure, phosphorus had been favored due to its higher conductance and higher breakdown voltage relative to those of arsenic. The disadvantage of phosphorus is its long diffusion length that causes the LOD barrier potential to be pulled down, thereby reducing the charge capacity. Use of boron co-implanted with the phosphorus, and/or an adjustment in the LOD barrier implant dose, is generally required to counteract the pull-down effect of the phosphorus, adding complexity to the device processing. The potential in the channel stop region, likewise, is subject to pull-down by the LOD formed with phosphorus impurities. An LOD under the field dielectric with arsenic impurities, on the other hand, diffuses much more slowly than one formed with phosphorus impurities, and therefore exerts much less of an influence on neighboring potentials in the pixel. The use of co-implanted boron impurities to compensate for the presence of the phosphorus impurities is therefore unnecessary, which further improves drain conductivity. Alternatively, the need for adjustment in the barrier implant is also reduced. In summary, the use of arsenic for the LOD formation is clearly preferred for pixel scaling efforts intended to improve image resolution.

The invention has been described in detail with particular reference to certain preferred embodiments thereof, but it will be understood that variations and modifications can be effected within the spirit and scope of the invention.

For example, although this invention has been described using a p-type silicon substrate and channel stops with an n-type buried channel and overflow drain, an n-type substrate could be used by using the opposite conductivity types for the various other implants. It is also to be understood that, although the drawings show only one CCD and its corresponding lateral overflow drain, there are a plurality of such CCDs and their corresponding lateral overflow drain, anti-blooming structures.

PARTS LIST

10 CCD and its anti-blooming structure
20 substrate
30 buried channel
40 barriers
50 dielectric
60 lateral overflow drain
70 channel stop
80 thin, active area dielectric
90 thick field dielectric
100 gate electrode

What is claimed is:

1. An image sensor having an anti-blooming structure, the image sensor comprising:
    (a) a semiconducting substrate of a first conductivity type;
    (b) a dielectric having a first thin portion and a second thick portion in which the dielectric includes only dielectric material therein;
    (c) a buried channel of the second conductivity type within the substrate substantially spanning the first thin portion; and
    (d) a lateral overflow drain region of the second conductivity type disposed substantially in its entirety spanning a portion of the second thick portion for collecting excess photogenerated charges for preventing blooming.

2. The image sensor as in claim 1 further comprising a channel stop of the first conductivity type positioned adjacent the lateral overflow drain spanning a portion of the second thick portion.

3. The image sensor as in claim 1 further comprising a barrier region disposed adjacent the lateral overflow drain.

4. The image sensor as in claim 3 further comprising a gate electrode covering the thin and thick portions.

5. The image sensor as in claim 1, wherein the first conductivity is a p-type and the second conductivity is an n-type.

6. The image sensor as in claim 1, wherein said lateral overflow drain is formed using arsenic impurities.

7. An image sensor having an anti-blooming structure, the image sensor comprising:
    (a) a semiconducting substrate of a first conductivity type;
    (b) a dielectric having a first thin portion and a second thick portion in which the dielectric includes substantially only dielectric material therein;

(c) a buried channel of the second conductivity type within the substrate substantially spanning the first thin portion; and (d) a lateral overflow drain region of the second conductivity type disposed substantially in its entirety spanning a portion of the second thick portion for collecting excess photogenerated charges for preventing blooming.

8. The image sensor as in claim 7 further comprising a channel stop of the first conductivity type positioned adjacent the lateral overflow drain spanning a portion of the second thick portion.

9. The image sensor as in claim 7 further comprising a barrier region disposed adjacent the lateral overflow drain.

10. The image sensor as in claim 9 further comprising a gate electrode covering the thin and thick portions.

11. The image sensor as in claim 7, wherein the first conductivity is a p-type and the second conductivity is an n-type.

12. The image sensor as in claim 7, wherein said lateral overflow drain is formed using arsenic impurities.

* * * * *